US006563749B2

(12) United States Patent
Ferrant

(10) Patent No.: US 6,563,749 B2
(45) Date of Patent: May 13, 2003

(54) DYNAMIC MEMORY CIRCUIT INCLUDING SPARE CELLS

(75) Inventor: Richard Ferrant, Crolles (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 09/895,026

(22) Filed: Jun. 29, 2001

(65) Prior Publication Data

US 2002/0001242 A1 Jan. 3, 2002

(30) Foreign Application Priority Data

Jun. 30, 2000 (FR) .............................................. 00 8498

(51) Int. Cl.$^7$ ................................................ G11C 7/00
(52) U.S. Cl. ........................ 365/200; 365/149; 365/154
(58) Field of Search ................................. 365/200, 149, 365/154

(56) References Cited

U.S. PATENT DOCUMENTS 4,473,895 A    9/1984  Tatematsu
4,608,666 A    8/1986  Uchida
5,295,114 A *  3/1994  Kobayashi ................... 365/200
5,634,105 A *  5/1997  Mizuno ................... 365/230.02

OTHER PUBLICATIONS

French Search Report from French Patent Application 00 08498, filed Jun. 30, 2000.
Akira Tanabe et al. "A 30-NS 64-MB DRAM with Built-In Self-Test and Self-Repair Function", IEEE Journal of Solid-State Circuits, US, IEEE Inc. New York, vol. 27, No. 11, Nov. 1, 1992, pp. 1525–1531.
Patent Abstracts of Japan, vol. 005, No. 073 (P–061), May 15, 1981 & JP 56 019595 A (Fujitsu Ltd.).

* cited by examiner

Primary Examiner—Huan Hoang
(74) Attorney, Agent, or Firm—Wolf, Greenfield & Sacks, P.C.; James H. Morris

(57) ABSTRACT

A dynamic memory circuit including memory cells arranged in an array of rows and columns, each row capable of being activated by a word line and each column being formed of cells connected to a first and to a second bit lines, which includes at least one, spare row formed of static memory cells, adapted to being activated to replace a memory cell row, each spare cell being connected to the first and second bit lines of a column of the circuit.

18 Claims, 5 Drawing Sheets

DYNAMIC MEMORY CIRCUIT INCLUDING SPARE CELLS

BACKGROUND OF THE INVENTION

1. Field of the Invention

The present invention relates to DRAMs, and more specifically to DRAMs provided with spare structures for replacement of defective cells.

2. Discussion of the Related Art

FIG. 1A schematically shows a conventional DRAM architecture 2 arranged in rows and columns of memory cells 4 (MC). Each cell 4 (MC) is connected to a bit line 6 and to a word line 8 (WLi), with i ranging from 1 to n, n being the number of memory rows. Each memory cell column includes two bit lines 6 (BL1, BL2). The memory cells of each column are arranged alternately, the cells of the odd and even rows being respectively accessible by first and second bit lines BL1 and BL2. A cell, including a capacitor having a terminal connected to ground and a terminal connected to a bit line via a transistor that can be activated by a word line, is illustrated in FIG. 1B. A row address decoder (not shown) is provided for receiving an address and providing an activation signal on the corresponding word line WLi. A sense amplifier 10 (SA) has its two inputs respectively connected to the two bit lines BL1 and BL2. For clarity, only two bit lines and n rows of memory 2 have been shown in FIG. 1A.

A read/write operation in such a memory includes the following succession of steps. The information to be stored into cells MC is first written into each of these cells. This writing consists, by an addressing of the chosen cell and an appropriate connection of the corresponding bit line, of writing into each cell a high voltage or a low voltage. The low voltage substantially corresponds to the ground voltage and the high voltage is close to supply voltage VDD. However, in practice, the high voltage will inevitably be smaller than voltage VDD and moreover tends to decrease along time. This is why a periodic refreshment of the memory cells is further provided. Before each read operation, a bit line precharge operation is performed, that is, a given voltage, currently VDD/2, is applied to each bit line and is stored on the capacitor of this line. During an actual read operation, such as illustrated in FIG. 2, at a time t0, a memory cell is addressed and voltage VDD/2 initially existing on the bit line rises if the involved memory cell has stored a "1" (high voltage) and falls if the involved memory cell has stored a "0" (low voltage), and differential amplifier 10 measures the difference between this raised voltage or this lowered voltage and voltage VDD/2. However, due to the dissymetry of the operations of charge of a "1" and of a "0", the difference between the two inputs of the operational amplifier will be smaller in the case where a "1" has been stored than in the case where a "0" has been stored. This difference will for example be, as indicated in FIG. 2, on the order of 100 millivolts for the storage of a "1" and on the order of 150 millivolts for the storage of a "0". To solve this problem, the voltage received by the input of amplifier 10, which is not connected to the read memory cell, is generally modified to be made to fall to a value $V_{REF}$ smaller than VDD/2, so that, as illustrated in FIG. 2, the difference between voltage $V_{REF}$ and a high read voltage is substantially the same as the difference between voltage $V_{REF}$ and a low read voltage.

FIG. 3 schematically shows a conventional DRAM 12, similar to memory 2 of FIG. 1, each bit line of which is further connected to a voltage adjustment cell 14 (REF). Each of cells 14 is activated to bring the line to which it is connected to previously-defined value $V_{REF}$ at the beginning of a read phase of an adjacent line. Cells 14 are connected by activation lines 16 (RL1, RL2) to the row address decoder (not shown). The structure of voltage adjustment cells 14, which is known, will not be detailed herein.

Further, conventional DRAMs such as those described in FIGS. 1 and 3 come up against other problems. Indeed, the bit lines are generally relatively long and very close to one another. Thus, when two bit lines are simultaneously read, the voltage present on the first bit line can have an influence upon the voltage of the second bit line and disturb its reading. A solution to this problem consists of having each pair of bit lines cross once or several times, as schematically shown in FIG. 4A.

FIG. 4A shows two bit line pairs (BL1, BL2 and BL3, BL4) of a DRAM 18 with 256 rows. Each bit line is connected to 128 alternately arranged memory cells 4 (MC). Further, due to the bit line crossings, the rows of memory 18 are arranged in four sectors of 64 rows each, respectively corresponding to rows 1 to 64, 65 to 128, 129 to 192, and 193 to 256.

In the first sector, each odd row includes two adjacent memory cells respectively connected to bit lines BL1 and BL3 and each even row includes two adjacent memory cells respectively connected to bit lines BL2 and BL4. Bit lines BL1 and BL2 cross between rows 64 and 65 so that, in the second sector, the memory cells of the odd rows are respectively connected to bit lines BL2, BL3, and the memory cells of the even rows are respectively connected to bit lines BL1, BL4. Similarly, lines BL3 and BL4 cross between rows 128 and 129. Finally, lines BL1 and BL2 cross between rows 192 and 193. Each row can be activated by a word line WL1 to WL256.

Some memory cells 4 may be defective. To replace the defective cells, spare cells arranged in rows and columns are generally provided. When a defective cells is found, the row or column where this cell is present is "replaced" with a spare row or column. This is done by modifying the address decoder so that it addresses, instead of the defective row or column, a spare row or column. When several cells in a same row are defective, the row of these cells is "replaced", which eliminates several defects at once.

FIG. 4B schematically shows rows of spare cells SC intended for replacing a defective row of memory 18. Bit lines BL1 to BL4 correspond to the end of the bit lines of FIG. 4A. Since there are four types of memory cell rows in memory 18, it is necessary to provide four spare rows to replace any row in the memory. When a row of memory 18 is deflective, the type of row involved is first determined. Then, a predetermined spare row corresponding to the type of the row to be replaced is associated therewith. Thus, for example, the odd rows of sector 1 and the even rows of sector 3 have the same configuration as the first spare row illustrated in FIG. 4B and will be replaced by it. Then, the address decoder will definitively associate the address of the defective row with that of the spare row. Each spare row is activated by an activation line, SELi, which will be activated upon addressing of the row.

When the number of errors desired to be corrected increases, the number of spare rows becomes high (all the more as four types of spare rows must be provided) and this creates many problems. Thus, the presence of many spare rows, connected to the bit lines, imposes a significant lengthening thereof, which reduces the voltage variation associated with the reading from a cell of a bit line. Also, when the number of spare rows is increased, the risks for a cell in a spare row to be itself defective is increased for statistical reasons, and the provision of spare cells replacing possible defective spare cells risks making the system complicated and difficult to manage. The spare rows further increase the total surface area occupied by the memory and the cost thereof. Further, the step of replacing a row containing a defective cell with a spare row is complex, since it requires precisely identifying the type of the row to replace it with an appropriate spare row taken from among all the available spare rows.

SUMMARY OF THE INVENTION

An object of the present invention is to provide, in a memory circuit, a spare memory cell row structure having a simpler and more efficient implementation.

Another object of the present invention is to provide such a circuit that occupies a reduced surface area as compared to conventional circuits with spare cells.

To achieve these objects, as well as others, the present invention provides a dynamic memory circuit including memory cells arranged in an array of rows and columns, each row being capable of being activated by a word line and each column being formed of cells connected to a first and to a second bit line, which includes at least one spare row formed of static memory cells, adapted to being activated to replace a memory cell row, each spare cell being connected to the first and second bit lines of a column of the circuit.

According to an embodiment of the present invention, the memory cell row replaced by the spare row is not addressed upon addressing of the spare row.

According to an embodiment of the present invention, the memory cell row replaced by the spare row is addressed upon addressing of the spare row.

According to an embodiment of the present invention, the bit lines cross at least once.

According to an embodiment of the present invention, the memory circuit further includes a sense amplifier on each memory column, the inputs of the amplifier being respectively connected to the first and second bit lines.

According to an embodiment of the present invention, the memory circuit further includes rows of voltage adjustment cells arranged either between the memory, cells of the memory and the spare cells or between the spare cells and the sense amplifiers.

The foregoing objects, features and advantages of the present invention, will be discussed in detail in the following non-limiting description of specific embodiments in connection with the accompanying drawings.

DETAILED DESCRIPTION

Figure 1A:
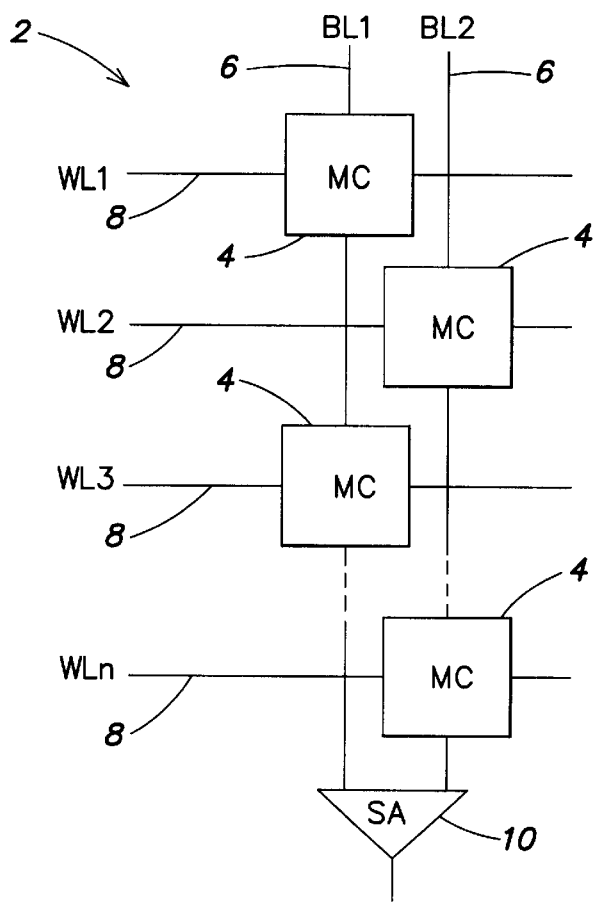
FIG. 1A, previously described, schematically shows a conventional DRAM structure.
Figure 1B:
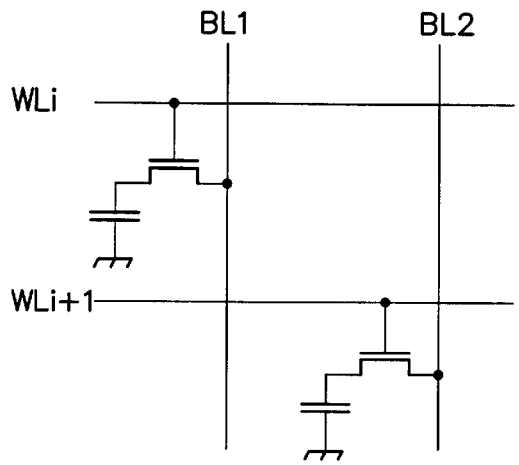
FIG. 1B illustrates the shape of the cells of FIG. 1A.
Figure 2:
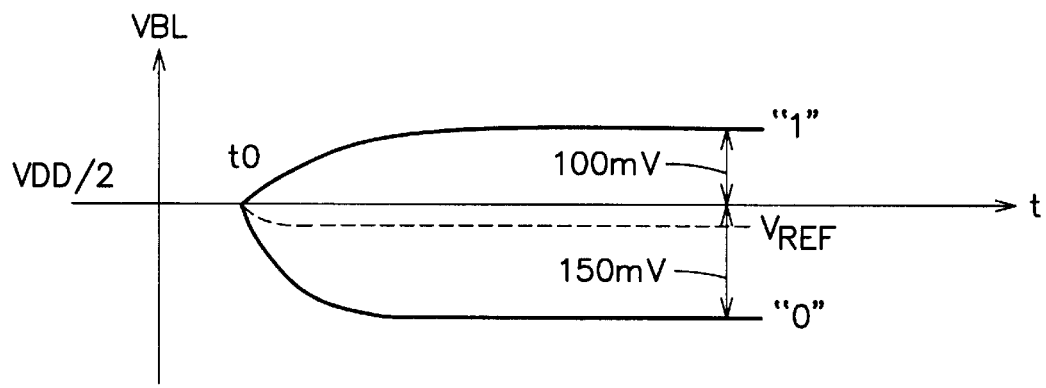
FIG. 2, previously described, illustrates the voltages on bit lines upon reading from a cell of the memory of FIG. 1.
Figure 3:
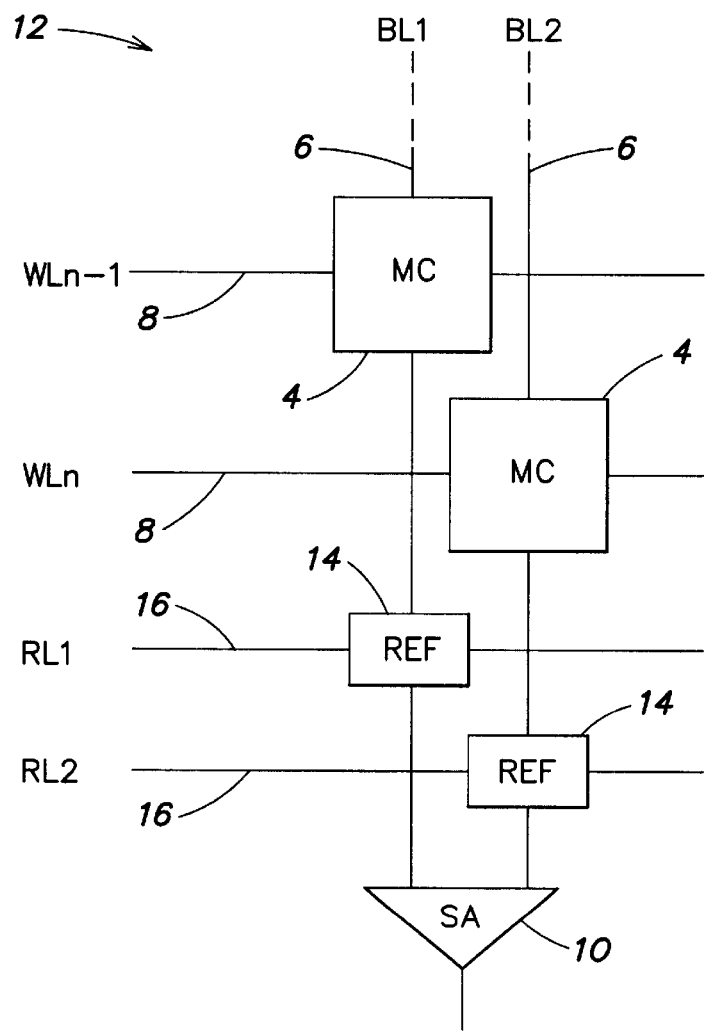
FIG. 3, previously described, schematically shows another conventional DRAM structure.

In the drawings, same references designate same elements. Only those elements necessary to the understanding of the present invention have been shown.

Figure 5:
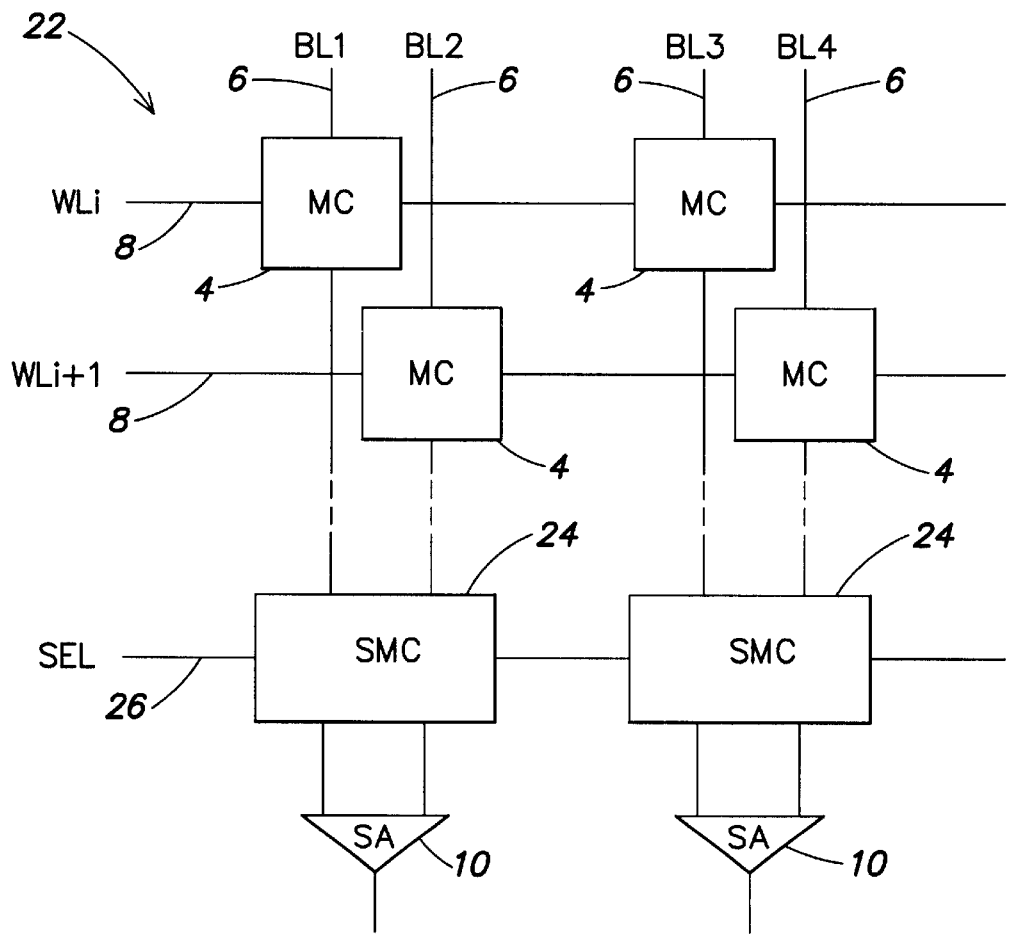
FIG. 5 schematically shows a DRAM structure according to the present invention.

FIG. 5 illustrates a memory circuit 22 including memory cells MC arranged in an array of rows and columns. Each row can be activated by a word line WL. Each column is formed of memory cells 4 connected to two bit lines BL1 and BL2, connected to a sense amplifier 10. Four consecutive bit lines, BL1 to BL4, are illustrated. FIG. 5 also illustrates a spare row 26, controlled by a selection line SEL. Spare row 26 is formed of spare cells SMC each connected to the two bit lines of a column, on the one hand, and to sense amplifier 10 of the column, on the other hand. According to the present invention, spare cells SMC are static memory cells (SRAM). Each cell 24 can receive and store data from the first or second bit line in the column. In read mode, cell SMC will bring the bit line that has been used for its writing to a voltage corresponding to the data stored therein.

Figure 4A:
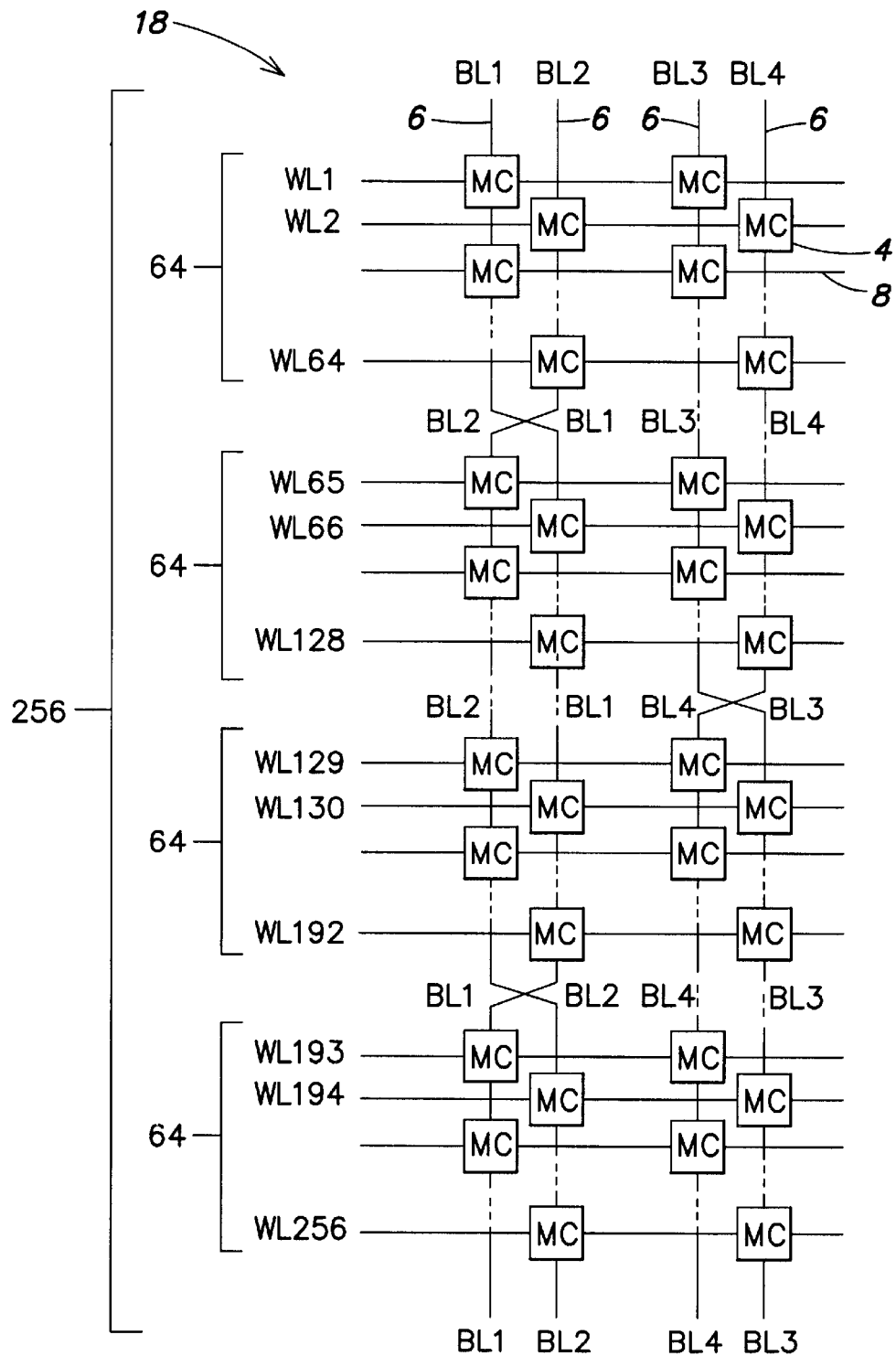
FIG. 4A, previously described, schematically shows another conventional DRAM structure.
Figure 4B:
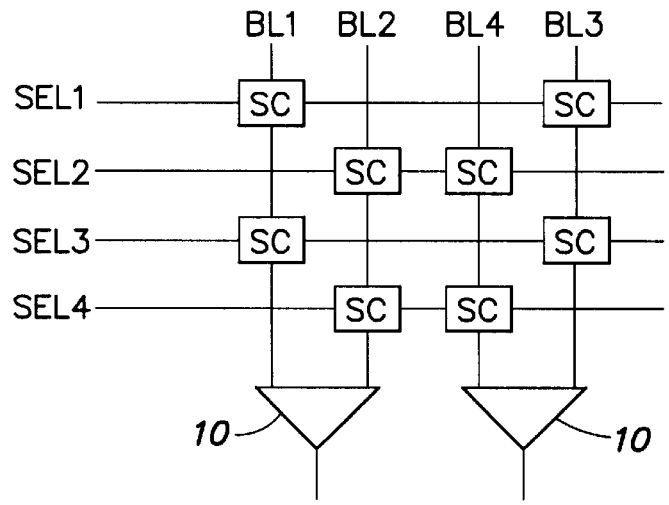
FIG. 4B previously described, schematically shows the spare row arrangement of the structure of FIG. 4A.

Cell 24 can replace any defective row of memory circuit 22. In FIG. 4B, the replacing of the odd lines of sector 1 will have to be performed by means of first row SEL1 of spare cells. With the structure of FIG. 5, it will be sufficient to write into cell 24 of the first column by means of bit line BL1 and into cell 24 of the second column by means of bit line BL3. Similarly, for the odd rows of the third sector, for example, the second row SEL2 of spare cells should in the prior art be activated to replace the defective row. In the embodiment of the present invention, the same cell row SMC can be used to also replace this type of defective row, it being sufficient, in this case, to write into cell 24 of the first column by means of bit line BL1 and to write into cell 24 of the second column by means of bit line BL4. Accordingly, a single row of spare cells 24 is enough to replace any row of the DRAM. This is particularly advantageous in a case like that of FIG. 4A, where four spare rows must be provided to replace any memory row.

If several defective rows are desired to be replaced, it will be sufficient to provide as many spare rows as there are rows to be replaced, which increases the length of the bit lines in a limited way.

Another advantage of using SRAM cells 24 as spare cells is that, upon their reading, such cells provide the bit lines with much higher voltage levels than the levels provided by conventional DRAM spare cells, as will be seen hereafter.

When, during a test step, a defective cell 4 is detected, a repair operation includes reprogramming the row address decoder (not shown) so that it definitively associates the address of the row containing the defective cell to a spare row. This reprogramming operation of the address decoder here is particularly simple due to the fact that a spare row according to the present invention can replace any defective row, whatever its parity or the sector in which it is located. Such a modification of the address decoder is within the abilities of those skilled in the art and will be detailed no further.

As has just been described, a single spare row according to the present invention generally enables replacing several conventional spare rows (two if the memory has alternate cells with no bit line crossing, four if the memory is of the type of memory 18) and this generally results in a gain in the surface occupied by the memory. On the other hand, since a spare row can be used to replace any defective row of the memory circuit, the implementation of the spare rows according to the present invention is particularly simple.

Figure 6:
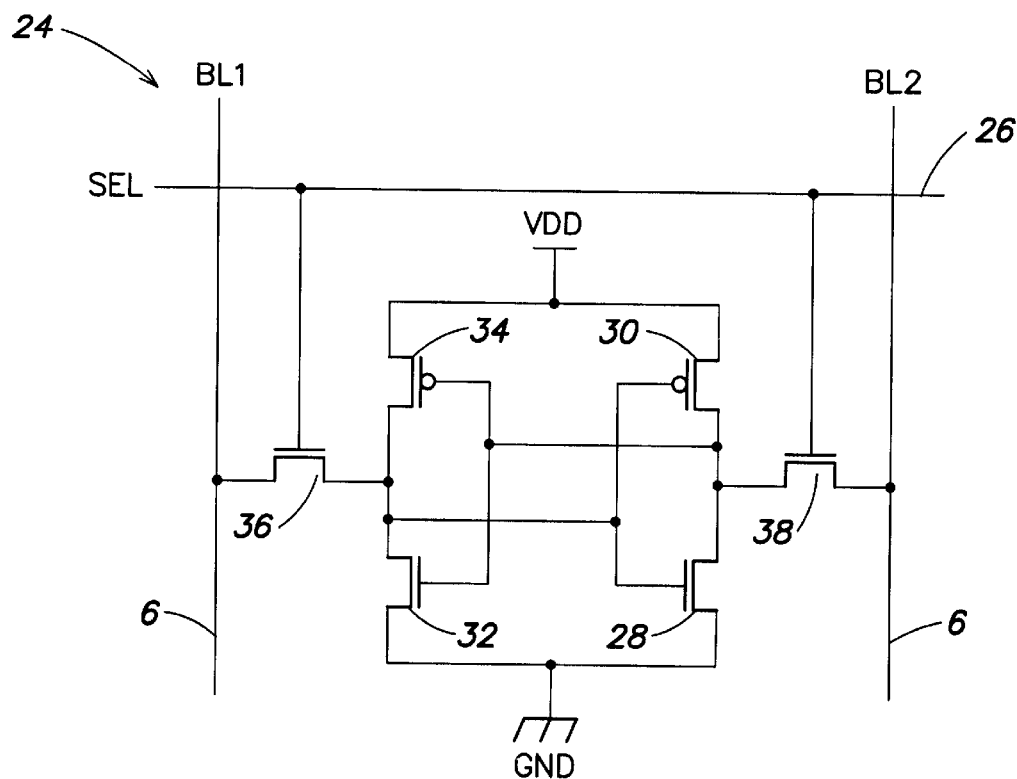
FIG. 6 shows an embodiment of a spare memory cell that can be used in the present invention.

FIG. 6 shows the diagram of an example of a SRAM-type spare cell 24 usable in the present invention. Cell 24 includes a first pair of transistors formed of an N-type MOS transistor 28 and of a P-type MOS transistor 30 and a second pair of transistors formed of an N-type MOS transistor 32 and of a P-type MOS transistor 34. The first and second transistor pairs are connected to respectively form a first and a second inverters, each supplied by the supply voltage and the ground, respectively VDD and GND. The input of the first inverter, connected to the output of the second inverter, is also connected via an N-type MOS transistor 36 to bit line BL1. The input of the second inverter, connected to the output of the first inverter, is also connected via an N-type MOS transistor 38 to bit line BL2. The gates of transistors 36 and 38 are connected to selection line 26. The operation of cell 24, which is known, will not be described herein.

Figure 7:
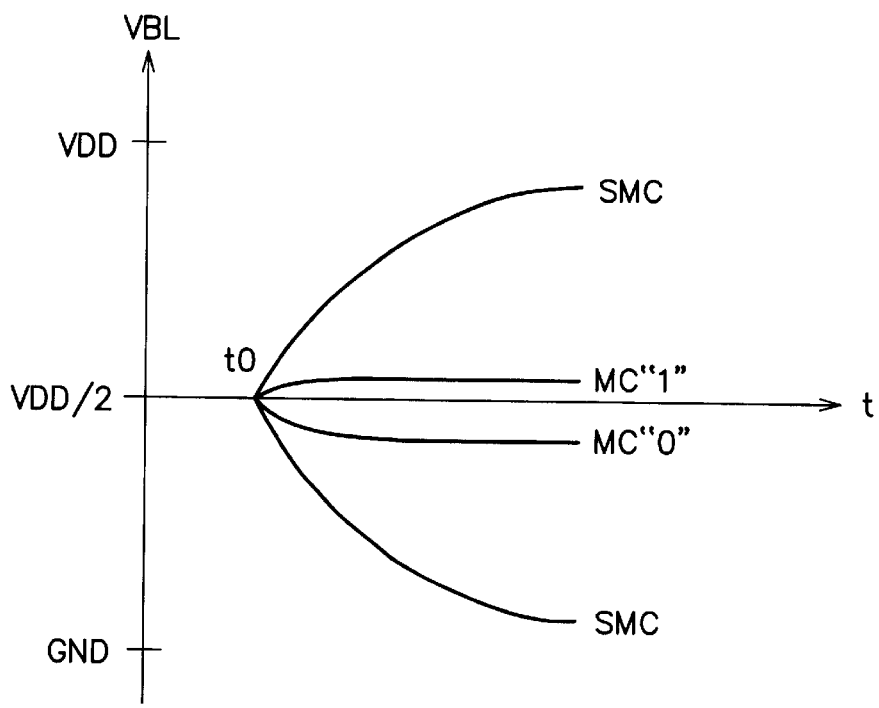
FIG. 7 illustrates the voltages on the bit lines upon reading from a spare memory cell according to the present invention.

FIG. 7 illustrates the voltages present on bit lines BL1 or BL2 upon reading from cell 24 of FIG. 6. These voltages correspond to supply voltages VDD and GND. Thus, whatever the information ("1" or "0") stored in cell 24, one of the bit lines is substantially brought to ground GND and the other one of the bit lines is substantially brought to voltage VDD upon reading from cell 24. This is illustrated by curves SMC of FIG. 7.

In FIG. 7 are also schematically shown the voltages involved upon reading of an information "1" (reference MC"1") or "0" (reference MC"0") from a conventional spare cell with a DRAM structure.

When a row includes one or several defective cells and is replaced, the address decoder of the row is programmed to definitively associate the address of the defective row to the address of a spare row. The row containing the defective cell can then be deactivated during a reading or a writing of the spare row. However, given the clear difference of the voltage levels exhibited by the spare cells according to the present invention and the memory cells, it is possible, according to the present invention, not to deactivate the defective row upon use of the spare row. Each cell of the doubled defective row will then be written and read in parallel with a spare cell. If the value stored in the defective cell does not correspond to the value stored in the corresponding spare cell, the small voltage variation generated in read mode by the defective cell will be masked by the voltage provided by the spare cell and this will have no incidence upon the read value. Such an alternative enables simplifying the address decoder, which no longer needs deactivating the row containing a defective cell when it associates its address to that of a spare row.

Further, for the same reason, if the memory includes voltage adjustment cells 14, their activation or deactivation upon reading of a spare cell according to the present invention has no influence upon the read value.

Of course, the present invention is likely to have various alterations, modifications, and improvements which will readily occur to those skilled in the art.

For example, a SRAM cell 24 including six transistors has been shown in FIG. 6, but those skilled in the art will easily adapt the present invention to SRAM cells of smaller size, for example including four transistors, in particular in the case where the precharge voltage is VDD.

Further, although the present invention is particularly advantageous in the case of a memory of the type of memory 18, with bit line crossings, the present invention also has advantages in the case where the bit lines do not cross since, due to the alternate arrangement of the memory cells, two spare rows are necessary in prior art to replace any defective row, while the present invention requires a single spare row.

Such alterations, modifications, and improvements are intended to be part of this disclosure, and are intended to be within the spirit and the scope of the present invention. Accordingly, the foregoing description is by way of example only and only as defined in the following claims and the equivalents is not intended to be limiting. The present invention is limited thereto.

What is claimed is:

1. A dynamic memory circuit including memory cells arranged in an array of rows and columns, each row capable of being activated by a word line and each column being formed of cells connected to a first and to a second bit line, the cells of the odd and even rows being respectively accessible by said first and second bit lines, and at least one spare row formed of static memory cells, adapted to being activated to replace a memory cell row, each spare cell being connected to the first and second bit lines of a column of the circuit.

2. The memory circuit of claim 1, wherein the memory cell row replaced by the spare row is not addressed upon addressing the spare row.

3. The memory circuit of claim 1, wherein the memory cell row replaced by the spare row is addressed upon addressing the spare row.

4. The memory circuit of any of claim 1, wherein the bit lines cross at least once.

5. The memory circuit of any of claim 1, further including a sense amplifier on each memory column, inputs of the amplifier being respectively connected to the first and second bit lines.

6. The memory circuit of claim 5, further including rows of voltage adjustment cells arranged either between the memory cells of the memory and the spare cells or between the spare cells and the sense amplifiers.

7. In a memory cell array having a plurality of word lines for activating rows of the array and at least two bit lines for activating columns of the array, an apparatus comprising: at least one additional word line for activating spare memory cells; at least one additional row in the array, the at least one additional row having at least one static random access memory (SRAM) cell for replacing a defective memory cell, the at least one SRAM cell capable of being activated by at least one additional word line and at least two bit lines; and wherein the at least two bit lines cross at least once.

8. The apparatus of claim 7, further comprising a plurality of sense amplifiers for detecting voltages on bit lines, each sense amplifier corresponding to a column in the array and each sense amplifier coupled to two bit lines, the two bit lines corresponding to the column of the sense amplifier.

9. The apparatus of claim 8, further comprising a plurality of voltage adjustment cells for regulating voltages on bit lines, each voltage adjustment cell coupled to one of the at least two bit lines.

10. The apparatus of claim 9, wherein the voltage adjustment cell is coupled to one of the at least two bit lines between a dynamic memory cell of the array and an SRAM cell.

11. The apparatus of claim 9, wherein the voltage adjustment cell is coupled to one of the at least two bit lines between an SRAM cell and one of the plurality of sense amplifiers.

12. In a memory cell array having a plurality of word lines for activating rows of the array and at least two bit lines for activating columns of the array, a method comprising: providing at least one additional word line in the array for activating spare memory cells; providing at least one additional row in the array, the at least one additional row having at least one static random access memory (SRAM) cell for replacing a defective memory cell, the at least one SRAM cell capable of being activated by at least one additional word line and at least two bit lines; associating an address of a defective memory cell in the memory cell array with an address of the at least one SRAM cell; and simultaneously addressing a SRAM cell and a defective memory cell upon an attempt to access the SRAM cell.

13. The method of claim 12, further comprising sensing a voltage on one of the at least two bit lines to determine a value of a memory cell.

14. The method of claim 12, further comprising adjusting a voltage detected on one of the at least two bit lines by a predetermined value.

15. The method of claim 12, further comprising:
   addressing an SRAM cell without addressing a defective memory cell upon an attempt to access the SRAM cell.

16. In a dynamic memory circuit having an array of memory cells arranged in an array of rows and columns, each row capable of being activated by a word line and each column including cells connected to a first or to a second bit line and at least one spare row formed of static memory cells for replacing a memory cell row, each spare cell being connected to the first and second bit lines of a column of the circuit, the array of memory cells including at least one row having a defective memory cell, a method comprising:
   a) upon a request to access the defective memory cell, activating a word line associated with the at least one spare row;
   b) if the defective memory cell is connected to the first bit line of a column, activating the first bit line;
   c) if the defective memory cell is connected to the second bit line of the column, activating the second bit line; and
   d) accessing the spare memory cell in the at least one spare row connected to the word line associated with the at least one spare row and the first and second bit lines of the column.

17. The method of claim 16, wherein the act a) further comprises:
   activating the word line associated with the row having the defective memory cell.

18. The method of claim 16, wherein the act d) further comprises:
   accessing the defective memory cell.

* * * * *